(12) United States Patent
Ziadeh et al.

(10) Patent No.: US 10,483,177 B2
(45) Date of Patent: Nov. 19, 2019

(54) PACKAGE FOR A SEMICONDUCTOR DIE, METHOD FOR MAKING A DIE PACKAGING BARE DIE TAPE AND METHOD FOR SEMICONDUCTOR DIE PACKAGING

(71) Applicant: Intel Corporation, Santa Clara, CA (US)

(72) Inventors: Bassam Ziadeh, Gilbert, AZ (US); John Lofgren, Gilbert, AZ (US); Santosh Pabba, Aloha, OR (US); Kevin Pounds, Aloha, OR (US); Alin Ila, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 15/638,704

(22) Filed: Jun. 30, 2017

(65) Prior Publication Data
US 2019/0006251 A1 Jan. 3, 2019

(51) Int. Cl.
*H01L 23/13* (2006.01)
*H01L 23/31* (2006.01)
*H01L 23/00* (2006.01)
*H05K 13/00* (2006.01)

(52) U.S. Cl.
CPC .......... *H01L 23/13* (2013.01); *H01L 23/3121* (2013.01); *H01L 24/27* (2013.01); *H01L 24/29* (2013.01); *H01L 24/32* (2013.01); *H01L 24/83* (2013.01); *H05K 13/0084* (2013.01)

(58) Field of Classification Search
CPC ......... H01L 23/13; H01L 24/27; H01L 24/83; H01L 24/29; H01L 23/3121; H01L 24/32; H05K 13/0084
USPC ....................................... 257/693
See application file for complete search history.

(56) References Cited

U.S. PATENT DOCUMENTS

2015/0251351 A1* 9/2015 Feygin ............... B29C 67/0051
                                                    156/267
2017/0257990 A1* 9/2017 Ng ........................ H05K 13/0084
2017/0283144 A1* 10/2017 Mariani ................... H01L 23/10

* cited by examiner

*Primary Examiner* — Karen Kusumakar
*Assistant Examiner* — Adam S Bowen
(74) *Attorney, Agent, or Firm* — 2SPL Patent Attorneys PartG mbB; Kieran O'Leary

(57) ABSTRACT

A carrier medium for a semiconductor die includes a carrier tape with at least one pocket for the die to sit in and a selectively applied non-activated adhesive on the carrier tape.

25 Claims, 3 Drawing Sheets

PACKAGE FOR A SEMICONDUCTOR DIE, METHOD FOR MAKING A DIE PACKAGING BARE DIE TAPE AND METHOD FOR SEMICONDUCTOR DIE PACKAGING

FIELD

Examples relate to a carrier tape type package for a semiconductor die with a pocket for a die to sit in, to a method for manufacturing a carrier tape and to a method for semiconductor die packaging.

BACKGROUND

A package protects an enclosed object from a physical impact such as mechanical shock, vibrations, electrostatic charges, or acts as a barrier to chemical impact such as humidity, oxygen, or dust. Hence, a package enables temporary storage, safe transportation, display and handling of the object enclosed while the object enclosed can be removed without marks or signs of wear.

Especially within the semiconductor industry, where careful handling of the dies is crucial in order to minimize the yield loss, a microprocessor die needs to be removed from the package without damage. Microprocessors are block shaped devices typically made out of a solid semiconductor material in a batch type manufacturing process, where a wafer is singulated into individual dies. The singulated microprocessor die is usually transferred to a carrier tape, also referred to so as a bare die tape (BDT), for packaging after singulation and prior to inspection, shipment and assembly. Currently, this carrier tape type package is made out of a flat cuboid shaped material with a plurality of pockets formed into the carrier tape for the dies to sit in. After placing a die into the pocket of the carrier tape, a cover tape is attached to the carrier tape in order to seal the die in the pocket. The cover tape has a layer of heat activated adhesive (HAA) or a pressure activated adhesive (PAA). Both adhesion techniques require the entire cover tape surface area to be coated in the adhesive. When the cover tape seals the die in a carrier tape package, the pocket with the die is also exposed to the cover tape's adhesive. Since there is no alignment of the die in a carrier tape to the cover tape with existing toolsets, it is difficult to sufficiently seal the die in the carrier tape pocket. Conventional PPA techniques require an additional blocker layer applied to the faces of a semiconductor die in order to protect the die from the activation pressure. Due to the blocker layer, only the edges of the carrier tape may remain uncovered by the blocker layer, limiting the available cover tape sealing area to the reduced space around blocker layer.

Due to the limited possibility of die alignment in the carrier tape and the lack of adhesive application control with the cover tape, a sub-optimal sealing and die packaging is present. Especially the issues of dies sticking to the cover tape and gross die out of pocket (DOOP) translates to a yield loss as well as extensive waste of adhesive, when coating the entire cover tape surface area. In addition, the adhesive layer interferes with the manual and automated inspection of the die after packaging which leads to a high rejection rate.

There is a desire to improve the process of die packaging and die inspection.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
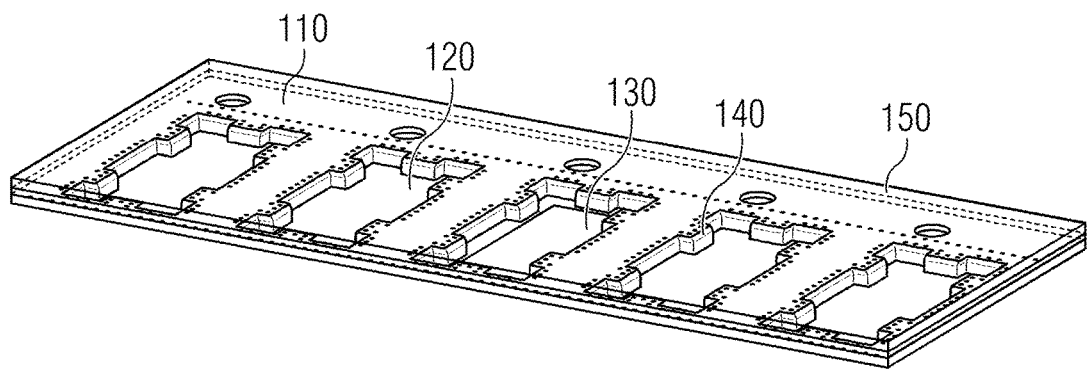
FIG. 1 illustrates an example of a carrier medium for a semiconductor die.

FIG. 1 shows an example for a carrier medium, also referred to as transport package, for a semiconductor die comprising a carrier tape 110 with at least one pocket 120 for the die 130 to sit in and a selectively applied non-activated adhesive 140 on the carrier tape.

Further to a die 130 sitting in the pocket 120, the carrier medium may also carry various other types of silicon products such as integrated circuit components, assembled semiconductor packages, finished packages and components attached to semiconductor devices.

With the selectively applied non-activated adhesive right on top of a carrier tape 110, also referred to as bare die tape, a die 130 can be placed in the pocket 120 of the carrier tape 110. To put the carrier tape 110 in context, a mono-layer cover tape 150 holds the die 130 in place. Due to the selective deposition process of the adhesive 140, the mono-layered cover tape 150 can be brought in direct contact with the die 130 (without the usual adhesive layer required for sealing). The mono-layered cover tape enables an unobscured inspection of the die. In addition, with the selectively applied adhesive 140 the amount of adhesion material reduces to a minimum and is only placed where needed for carrier medium sealing. Consequently, the encapsulated die 130 in the pocket 120 is sealed form physical and chemicals impacts and is ready for die inspection and shipment.

Other examples cover a die carrier medium comprising a carrier tape 110 with at least one pocket 120 for a die 130 to sit in, the semiconductor die 130 sitting in the pocket 120 and a cover tape 150 attached to the carrier tape 110 by a selectively applied non-activated adhesive. In the assembled carrier medium example above, the covered pocket 120 acts as a sealed container for the die 130 due to the selectively deposited adhesive 140. Since no adhesive is in contact with the die 130, the cover tape 150 attached to the carrier tape 110 does not interfere with the die 130 leading to a reduced yield loss when packaging and inspecting the die.

According to some examples, a carrier tape 110 as illustrated in FIG. 1 can be created by providing a tape material, forming a pocket 120 in the tape material for the die to sit in and applying an adhesive on a surface of the tape material.

Since the carrier tape 110, also referred to as bare die tape, can be manufactured from different types of materials, the dedicated pocket 120 for the die 130 to sit in enables a secure fit of the die in the carrier tape 110. The manufacturing process of the carrier tape 110 can be adjusted to the individual die 130 in terms of carrier tape material selection and pocket geometry, in order to eliminate DOOP scenarios. In addition, the carrier tape material can be flexible, enabling a press fit of the die 130 in the pocket 120 or can act as a carrier for a subsequent use in the die assembly stage. Further, the carrier tape 110 material can be stiff or flexible for stack or reel type packaging and storage.

According to other examples, a packaging method for a semiconductor die in a carrier tape with a selectively applied adhesive as previously discussed comprises the principles of placing a semiconductor device in form of a die 130 in a pocket 120 of a carrier tape 110 type carrier medium, placing a cover tape on a surface of the carrier tape 110 and coupling the cover tape and the carrier tape 110.

The sequential die packaging method reduces the complexity of die 130 packaging process when utilizing only the two components of carrier tape 110 and cover tape 150 leading to a potential increase in die carrier medium quality and die carrier medium processing time.

After die packaging, FIG. 1 illustrates an example of a semiconductor die 130 sitting in a dedicated pocket 120 in a carrier tape 110 covered by a cover tape 150 and sealed with a selectively applied adhesive 140 along the edge of a pocket.

Since the die 130 is sitting in a pocket 120 of the carrier tape 110 type carrier medium and is covered with a cover tape 150, the pocket 120 and the cover tape 150 seals the die 130 with the selectively applied non-activated adhesive layer 140 along the edge of the pocket 120 on top of the carrier tape 110. After die packaging and cover tape application, the adhesive is activated and the carrier medium is ready for processing.

The carrier tape 110 carries the semiconductor die 110 after wafer singulation and serves as a safe container for die inspection and shipment. This type of carrier medium is usually used for a plurality of dies 110 in a batch type semiconductor manufacturing process in order to handle individual dies 130 without damage. After shipment, the die 130 is removed from the container for hardware assembly. In order to meet the inspection, protection and transportation requirements, the semiconductor die 130 sits in a formed pocket 120 in the carrier tape 110 and is sealed with a protective cover tape 150. With the die 130 sitting in the pocket 120, the cover tape 150 is place on top of the carrier tape 110 covering the entire pocket surface area of the carrier tape 110. Consequently, the attached cover tape 150 covers the die 130 sitting in the carrier tape 110 pocket 120 and holds the die in place.

Since the cover tape 150 covers the die 130 sitting in the carrier tape 110 pocket and the selective adhesive 140 application around the pocket 120 seals the die directly (without the adhesive being in contact with the die), DOOP scenarios are fundamentally eliminated. In addition, since the cover tape 150 covers the die 130 sitting in the carrier tape 110 pocket across the entire surface area of the die, a rigid fit of the die 130 in the pocket 120 is guaranteed also leading to reduced DOOP scenarios.

While the mono-layered cover tape 150 on top of the carrier tape 110 seals the die 130, the film type cover tape 150 is attached to the carrier tape 110 carrier medium using an adhesive 140. The adhesive 140 is placed along the edge of a carrier tape 110 pocket 120 between the carrier tape 110 and the cover tape 150. With the protective cover tape 150 layer attached to the carrier tape 110, the pocket 120 in the carrier medium provides a sealed container for the die 130. This type of carrier medium enables a flat geometry of the die 130 pocket 120 and a continuous flow packaging method for reel or stack type die carrier tape storage and transportation.

According to some examples, the single layer cover tape 150 may provide an unobstructed view of the die 130 sitting in the pocket 120 and enables for an automated vision system the inspection of the die 130 without any additional intermitting layer, since only the cover tape 150 is holding the die 130 in place. In particular when using a translucent cover tape 150, the improved view also improves the inspection of the die through the cover tape reducing large overrejections. Since only the cover tape 150 is holding the die 130 in place, the homogeneous pressure distribution of the cover tape 150 may lead to a perpendicular viewing angle for the die 130 in the carrier medium helping to detect DOOP scenarios.

Figure 2:
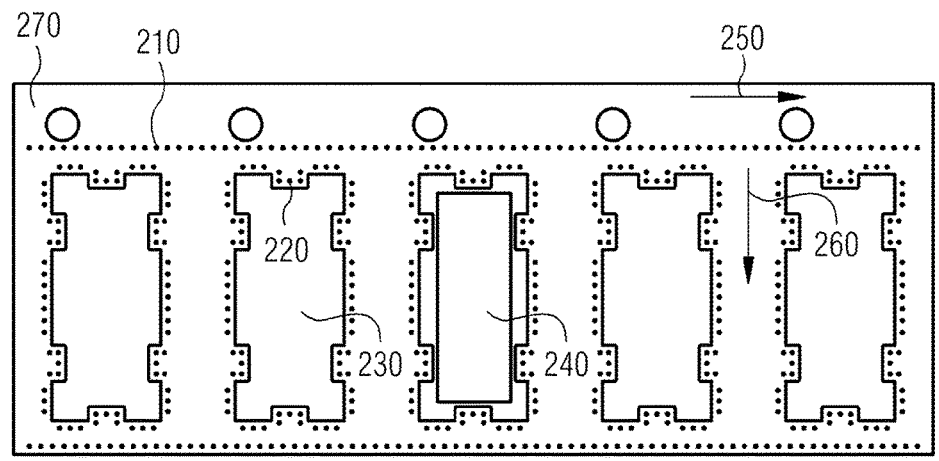
FIG. 2 illustrates an example of a carrier tape.

FIG. 2 shows a carrier tape 270 with an adhesive selectively applied and extending along a longitudinal 250 direction of a carrier tape 270 and along the lateral 260 direction around the edge 220 of a carrier tape 110 pocket 230. The combined application of the adhesive along the longitudinal 250 and lateral 260 direction on the carrier tape 270 may lead to a dedicated adhesion pattern along the edge of a pocket 230. The non-activated adhesive 210 and 220 is selectively applied on top of a carrier tape 270 prior to die packaging and provides an adhesion and sealing layer between the carrier tape 270 and the cover tape after activation.

According to the adhesive extending along the longitudinal 250 direction, any directed application of the adhesive by means of a controlled or selected deposition conducted along the longest distance of the carrier tape 270 can be considered longitudinal 250.

According to the adhesive extending along the lateral 260 direction, any directed application of the adhesive perpendicular to the longitudinal 250 direction of the adhesive by means of a controlled or selected disposition conducted on the carrier tape 270 can be considered lateral 260.

Since the non-activated adhesive is applied after the forming process of the carrier tape 110, or bare die tape, with a well-defined adhesion and seal locations 210 and 220, the adhesive provides a rim type seal for the die 240 in the pocket 230. Further, the dedicated adhesive dispense control enables a selective adhesive application in an intermitted flow like technique along 250 the carrier tape 270 leading to a fine intermitted line, or a line of single droplets, of adhesive for sealing, reinforcement and/or stiffening the carrier tape 270.

Concerning other possible examples, the dedicated adhesive dispense control also enables a selective adhesive application in a continuous flow like technique along 250 the carrier tape 270 leading to a fine continuous line of adhesive for sealing, reinforcement and/or stiffening the carrier tape 270.

While the adhesive is placed on top of the carrier tape 270 after the carrier tape 270 manufacturing process, the non-activated adhesion material can be directly applied in a drop like intermitted type point deposition or in a continuous flow type line deposition technique. For the selective distribution of the adhesive, conventional deposition techniques such as jet printing, paste printing or screen printing can be employed. When using an adhesive suitable for a selective deposition technique, substantial savings in adhesive quantity can be achieved, compared to conventional bulk film type deposition techniques such as roll-to-roll. In addition, the here proposed example can be applied without requiring modifications to the wafer-to-tape tools.

Since the non-activated adhesion material is directly applied on the carrier tape 110, and the cover tape 150 is formed from a mono-layer, the carrier medium consists of two components without other potential intermitting layers reducing the source for error when packing the die 130. When activating the adhesive in a successive packaging process, the adhesive pattern is independent of the die 130 in which the die 130 does not interfere with the adhesive activation process. In addition, due to the selective adhesive deposition on the carrier tape 110, the adhesive pattern is independent of the pocket location and/or geometry.

Due to the well-defined selective adhesive application on the carrier tape 110, the sequential die 240 packaging process is simplified compared to other conventional cover tape and die alignment procedures. After placing the die 240 into the pocket 230, the mono-layer film type cover tape 150 is placed on top of the carrier tape 110. With the well-defined adhesion/seal locations 210 and 220, the die 240 remains clean of the adhesive and is only covered by the cover tape 150 when sitting in the pocket 230.

Following the geometry of the pocket 230, no additional alignment of the die in the carrier medium is required due to the firm fit of the die in the pocket. This may lead to a reduced number of DOOP scenarios and can limit the possibility for misalignment of the die 240 prior to the adhesive activation process.

Due to the dedicated adhesive control with the deposition techniques employed, the non-activated adhesive can be carried out as a selectively applied line 210 along the carrier tape 110 and around the 220 pockets 230 in longitudinal 250 and lateral 260 direction which can be activated by heat or pressure.

According to the selectively applied non-activated adhesive along the carrier tape 110 and around the 220 pockets 230, the adhesive can also be activated using an ultraviolet (UV) light. Due to the contactless nature of the UV light, the activation process of the adhesive might not interfere with the die 240 sitting in the pocket 230.

Compared to the selectively applied a non-activated on the carrier tape 270 above, a selectively applied contact activated adhesive is also possible. With the contact activated adhesive, the adhesion between the carrier tape 270 and the cover tape 150 is activated as soon as the cover tape 150 is place on top of the carrier tape 270. When using the contact activated adhesive, the simplified packaging process reduces the number of packaging stages as well as extends the range of different types of adhesive for the carrier tape 270.

Since the controlled adhesion pattern can be applied along the longitudinal direction 250 of the carrier tape 270, the adhesive also supports the die carrier medium. The coverage of the adhesive line pattern can vary according to the packaging requirements, ranging from a relatively light coverage of 10 percent of adhesive per unit length over 20, 30, 50, up to a 100 percent of adhesive per unit length fully covering the adhesion pattern with a continuous line of adhesive using an intermitted or continuous flow deposition technique.

According to the extraction of the die from the carrier tape 270 carrier medium, the peel back force describes the separation of the cover tape 150 and the carrier tape 270. Due to the controlled application of the adhesive above, the peel back force with a relatively light adhesive coverage of 10 percent per unit length might be considerably lower compared to the example given 50 percent adhesive coverage per unit length scenario, where the peel back force might be high. High peel back forces potentially shake the die out of the pocket when separating the cover tape 150 from the carrier tape 270 which translates into a yield loss. For this reason, the controlled application of the adhesive allows balancing of the peel back force.

In other words, compared to other potential full screen adhesive cover tape type die carrier mediums, the fully flexible control of the adhesive application along with the variable adhesive pattern for the cover tape 150 on the carrier tape 270 may eliminate the possibility of dies sticking to the cover tape, enables the control of the peel back force when separating the cover tape 150 and the carrier tape 270, and allows a clear region above the cover tape, enabling automated inspection after adhesive activation.

Figure 3:
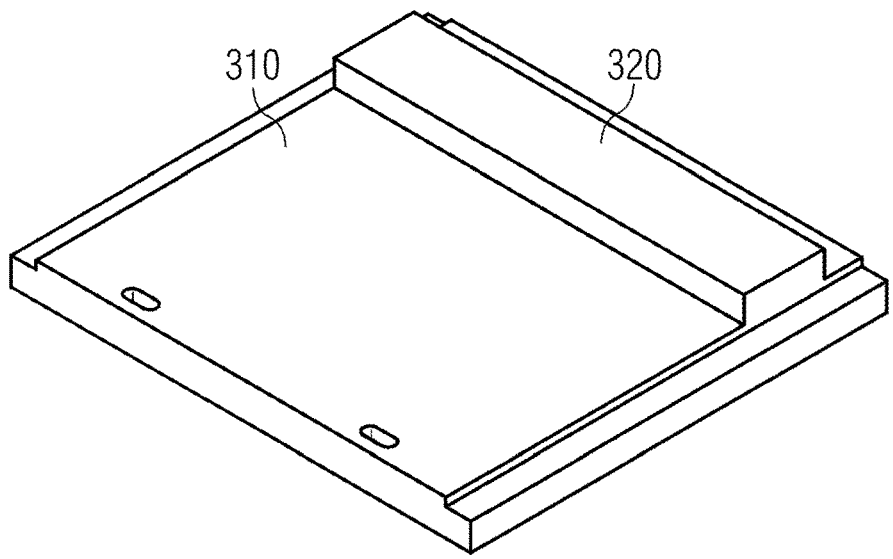
FIG. 3 illustrates an example of a block stamp.

FIG. 3 shows an example of a block type flat heating element 310 with a raised heater section 320 or elevation. The flat heating element 310 serves as a heat source for the adhesive in order to activate the non-activated adhesive in a semiconductor die carrier medium.

The simple geometry of the heater block 310 with a raised heater section 320 is suitable for activating the non-activated adhesive between the carrier tape 110 and the cover tape 150. With the selectively applied adhesive layer between the carrier tape 110 and the cover tape 150, the adhesion activation process closes the die packaging process sealing the two pieces together.

Since the die is sitting in the pocket of a carrier tape 110 and is covered by the cover tape 150, the adhesive activation seals the carrier medium in the adhesive locations utilizing a stamp type principle. The heat transferred from the flat heater section 320 to the adhesive by contact conduction is sufficiently high to activate the non-activated adhesive. While the die is sitting in the pocket of a carrier tape 110, other potential adhesive activation techniques are hot rolling of the carrier tape 110 or the cover tape 150. Alternatively, a pressure sensitive adhesive can be applied when squashing the cover tape 150 and the carrier tape 110 with a block stamp. Eventually, heat or pressure activation of the adhesive seals the semiconductor die 130 in the carrier medium closing the die packaging process.

When using a flat heater block 310 or heater section 320 stamp, the adhesive activation controls the alignment between the carrier tape 110 and the cover tape 150 by mechanical contact with the heat block 310 creating the seal. Due to mechanical contact, longitudinal seal lines for the carrier tape 110 and the cover tape 150 as well as lateral seal lines also control the alignment of the carrier tape 110 and the cover tape 150. Hence, compared to a system with only one longitudinal 250 seal line, the combined longitudinal 250 and lateral 260 seal lines create a fine discrete seal leading to small peel forces when unpacking the die.

In addition, due to the fine discrete seal and the mechanical control with the heater block 310 or fin 320 stamp, the risk of the die lodging itself between the cover tape and the top of the cover tape is reduced, which is also known as DOOP.

Figure 4:
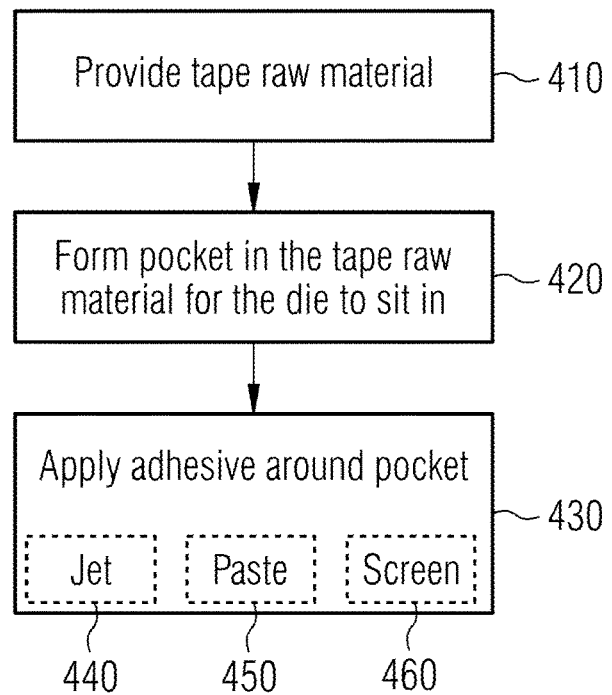
FIG. 4 illustrates a block diagram of an example of a method for manufacturing carrier type bare die tape packaging.

FIG. 4 shows a sequential flow diagram of a method for manufacturing a carrier tape 110, starting with the provision of the tape raw material 410 followed by forming a pocket into the carrier tape raw material 420 for the die to sit in and applying 430 the adhesive along the tape and around the pocket.

For the carrier tape 110 manufacturing process, a pocket 120 for the die to sit in is formed 420 in the carrier tape 110 material 410. The raw material of the carrier tape 110 can be a polymer or any other material suitable for the carrier tape 110 carrier medium. Based on the material employed, the carrier tape 110 carrier medium may be manufactured for single or multiple use and/or purpose.

The size of the pocket 120 in a carrier tape 110 is determined by the size of the die 130 to sit in and can be manufactured in an extrusion or molding process 420. Once the pocket 120 for the die 130 is formed, the non-activated adhesive layer is applied with respect to the size of the carrier tape 110 and the geometry of the pocket 120. Application techniques cover conventional deposition techniques such as jet printing 440, paste printing 450 or screen printing 460.

Figure 5:
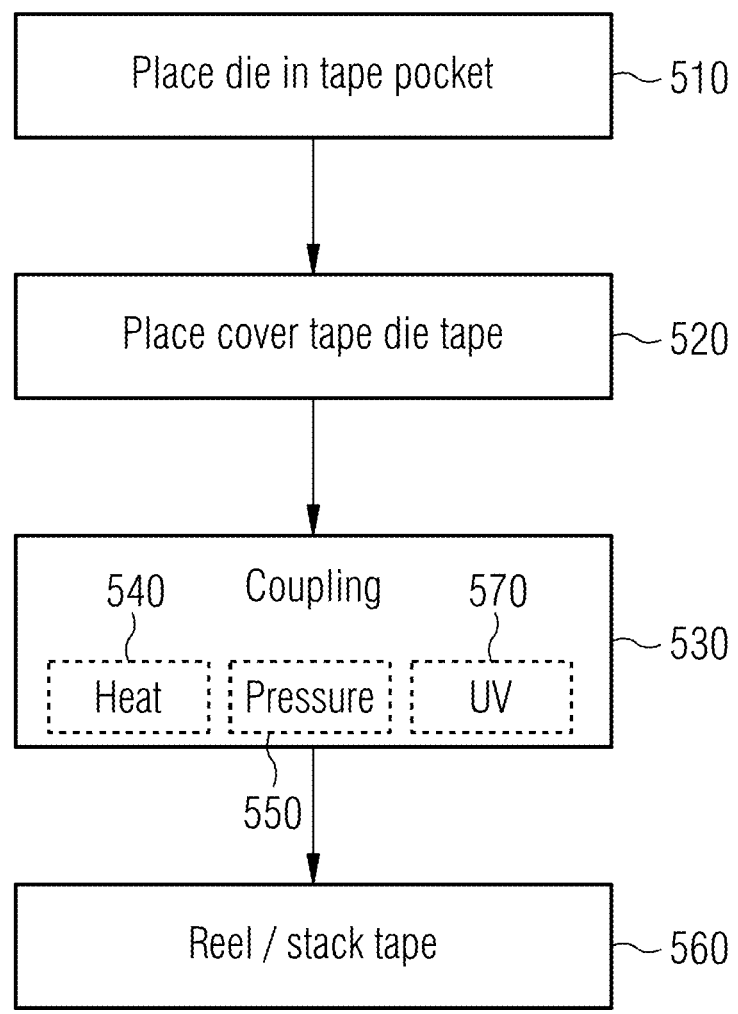
FIG. 5 illustrates a block diagram of an example of a method for a semiconductor die packaging.

FIG. 5 shows a sequential flow diagram of a method for semiconductor die packaging. The methods starts with placing 510 a die 130 in the carrier tape 110 pocket 120 followed by placing 520 the cover tape 150 on top of the carrier tape 110 and sealing 530 the carrier medium using a block stamp 530.

When placing the die 130 in the carrier tape 110 pocket 120, the automated die handling process is conducted after singulating a wafer into individual dies. Following this automated die 130 handling process, each die 130 is placed individually into the pockets 120, where the specific geometry of the pocket holds the die 130 in place. As soon as the die 130 is sitting in the carrier tape 110 pocket 120, the cover tape 150 is placed 520 on top of the carrier tape 110, encapsulating the die 240. Following the sequence of the flow diagram in FIG. 5, the block stamp fin 320 seals the die 240 in the pocket 230 activating the adhesive along 210 the carrier tape 110 and the adhesive around 220 the die 240 pocket 230. The packaging process is closed after activating the adhesive and sealing the pocket 230. Once the packing process is closed and the adhesive activated, the die 240 in the carrier tape 110 is ready for inspection and shipment.

Example 1 is a carrier medium for a semiconductor die, comprising a carrier tape with at least one pocket for the die to sit in and a selectively applied non-activated adhesive on the carrier tape.

In example 2, in the carrier medium of example 1, the adhesive extends along a longitudinal direction of the carrier tape.

In example 3, in the carrier medium of example 1 or 2, wherein the adhesive extends along a lateral direction of the carrier tape.

In example 4, in the carrier medium of example 1, the adhesive extends along a longitudinal and a lateral direction along an edge of a pocket.

In example 5, in the carrier medium of any of the preceding examples, the adhesive is applied in a continuous flow deposition process.

In example 6, in the carrier medium of any of the preceding examples, the adhesive is applied in an intermitted flow deposition process.

In example 7, in the carrier medium of any of examples 1 to 6, the adhesive can be activated by heat.

In example 8, in the carrier medium of any of examples 1 to 6, the adhesive can be activated by pressure.

In example 9, in the carrier medium of any of examples 1 to 6, the adhesive can be activated by ultraviolet light.

In example 10, the carrier medium of any of the preceding examples optionally further comprises a cover tape coupled to the carrier tape by the adhesive.

In example 11, the carrier medium of any of the preceding examples optionally further comprises a plurality of further pockets for further dies to sit in.

Example 12 is a carrier medium, comprising a carrier tape with at least one pocket; a semiconductor device sitting in the pocket; and a cover tape attached to the carrier tape by a selectively applied adhesive.

In example 13, in the carrier medium of example 12, the adhesive extends at least by 60 percent along an edge of the pocket.

Example 14 is a method for manufacturing a carrier tape for a semiconductor die, comprising providing a tape material; forming a pocket in the tape material for the die to sit in; and applying an adhesive on a surface of the tape material.

In example 15, in the method of example 14, applying the adhesive comprises a jet print deposition.

In example 16, in the method of example 14, applying the adhesive comprises a paste print deposition.

In example 17, in the method of example 14, applying the adhesive comprises a screen print deposition.

In example 18, in the method of any of examples 14 to 17, the adhesive is applied along a longitudinal and a lateral direction along an edge of the pocket.

In example 19, the method of any of examples 14 to 18, optionally further comprises reeling the carrier tape.

In example 20, the method of any of examples 14 to 18 optionally further comprises stacking the carrier tape.

Example 21 is a method for semiconductor die packaging, comprising placing a die in a pocket within a carrier tape of a carrier medium according to one of examples 1 to 9; placing a cover tape on a surface of the carrier tape; and coupling the cover tape and the carrier tape.

In example 22, in the method of example 21, coupling the cover tape and the carrier tape comprises activating the adhesive on the carrier tape.

In example 23, in the method of example 21 or 22, coupling the cover tape and the carrier tape comprises applying heat to the cover tape.

In example 24, in the method of example 21 or 22, coupling the cover tape and the carrier tape comprises applying pressure to the cover tape.

In example 25, in the method of any of examples 21 to 24, coupling the cover tape comprises using a block stamp.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A carrier medium for a semiconductor die, comprising:
    a carrier tape with at least one pocket for the die to sit in; and
    a selectively applied non-activated adhesive on the carrier tape wherein the adhesive is located outside of the at least one pocket.

2. The carrier medium of claim 1, wherein the adhesive extends along a longitudinal direction of the carrier tape.

3. The carrier medium of claim 1, wherein the adhesive extends along a lateral direction of the carrier tape.

4. The carrier medium of claim 1, wherein the adhesive extends along a longitudinal and a lateral direction along an edge of a pocket.

5. The carrier medium of claim 1, wherein the adhesive is applied in a continuous flow deposition process.

6. The carrier medium of claim 1, wherein the adhesive is applied in an intermitted flow deposition process.

7. The carrier medium of claim 1, wherein the adhesive can be activated by heat.

8. The carrier medium of claim 1, wherein the adhesive can be activated by pressure.

9. The carrier medium of claim 1, wherein the adhesive can be activated by ultraviolet light.

10. The carrier medium of claim 1, further comprising:
    a cover tape coupled to the carrier tape by the adhesive.

11. The carrier medium of claim 1, further comprising:
    a plurality of further pockets for further dies to sit in.

12. A carrier medium, comprising:
    a carrier tape with at least one pocket and a selectively applied non-activated adhesive on the carrier tape;
    a semiconductor device sitting in the pocket; and
    a cover tape attached to the carrier tape by activation of the selectively applied adhesive.

13. The carrier medium of claim 12, wherein the adhesive extends at least by 60 percent along an edge of the pocket.

14. A method for manufacturing a carrier tape for a semiconductor die, comprising:
    providing a carrier tape material;
    forming a pocket in the carrier tape material for the die to sit in; and
    applying an adhesive on a surface of the carrier tape material outside of the pocket.

15. The method of claim 14, wherein applying the adhesive comprises a jet print deposition.

16. The method of claim 14, wherein applying the adhesive comprises a paste print deposition.

17. The method of claim 14, wherein applying the adhesive comprises a screen print deposition.

18. The method of claim 14, wherein the adhesive is applied along a longitudinal and a lateral direction along an edge of the pocket.

19. The method of claim 14, further comprising:
    reeling the carrier tape.

20. The method of claim 14, further comprising:
    stacking the carrier tape.

21. A method for semiconductor die packaging, comprising:
    placing a die in a pocket within a carrier tape of a carrier medium, the carrier medium comprising:
        a carrier tape with at least one pocket for the die to sit in; and
        a selectively applied non-activated adhesive on the carrier tape outside of the at least one pocket;
    placing a cover tape on a surface of the carrier tape; and
    coupling the cover tape and the carrier tape.

22. The method of claim 21, wherein coupling the cover tape and the carrier tape comprises activating the adhesive on the carrier tape.

23. The method of claim 21, wherein coupling the cover tape and the carrier tape comprises applying heat to the cover tape.

24. The method of claim 21, herein coupling the cover tape and the carrier tape comprises applying pressure to the cover tape.

25. The method of claim 21, wherein coupling the cover tape and the carrier tape comprises using a block stamp to apply pressure to the cover tape.

* * * * *